US011808822B2

(12) United States Patent
Li et al.

(10) Patent No.: US 11,808,822 B2
(45) Date of Patent: Nov. 7, 2023

(54) LEAKAGE CURRENT DETECTION INTERRUPTER

(71) Applicant: Chengli Li, Suzhou (CN)

(72) Inventors: Chengli Li, Suzhou (CN); Xiaoming Zhang, Suzhou (CN); Zenghui Lv, Suzhou (CN)

(73) Assignee: Chengli Li, Suzhou (CN)

( * ) Notice: Subject to any disclaimer, the term of this patent is extended or adjusted under 35 U.S.C. 154(b) by 133 days.

(21) Appl. No.: 17/472,404

(22) Filed: Sep. 10, 2021

(65) Prior Publication Data
US 2023/0073077 A1 Mar. 9, 2023

(30) Foreign Application Priority Data

Sep. 8, 2021 (CN) .......................... 202122163767.4

(51) Int. Cl.
G01R 31/52 (2020.01)
H02H 3/33 (2006.01)
H02H 3/08 (2006.01)
H02H 3/16 (2006.01)

(52) U.S. Cl.
CPC .............. G01R 31/52 (2020.01); H02H 3/08 (2013.01); H02H 3/16 (2013.01); H02H 3/335 (2013.01)

(58) Field of Classification Search
CPC . G01R 31/52; H02H 3/08; H02H 3/16; H02H 3/335
See application file for complete search history.

(56) References Cited

U.S. PATENT DOCUMENTS 2,759,165 A  *  8/1956  Batcheller ............ H01R 13/115
                                                    439/849
11,626,264 B1 * 4/2023  Aromin ................ H02H 1/0007
                                                    361/93.1
2010/0046128 A1 * 2/2010 Wang ..................... H01H 83/14
                                                    361/42

* cited by examiner

Primary Examiner — Scott Bauer
(74) Attorney, Agent, or Firm — Chen Yoshimura LLP

(57) ABSTRACT

An LCDI device includes a shell, a movement unit, and a wire bundle assembly. The shell includes a base and an upper cover connected to each other. The movement unit is disposed in the base, and includes at least one connecting conductor. A first end of the wire bundle assembly is disposed in the upper cover and includes at least one shield detection line, where the shield detection line is electrically coupled to the connecting conductor. The shield detection line includes a connecting terminal at the first end of the wire bundle assembly which is configured to received and retain the connecting conductor inserted therein. The structure of the LCDI enables fast and secure assembling of the wire bundle assembly and movement unit, and eliminates the need for internal re-adjustment of the shield detection lines after assembling, which promotes automation of large scale production.

12 Claims, 7 Drawing Sheets

LEAKAGE CURRENT DETECTION INTERRUPTER

BACKGROUND OF THE INVENTION

Field of the Invention

This invention relates to electrical circuit protection, and in particular, it relates to a leakage current detection interrupter (LCDI) device.

Description of Related Art

With the wide use of home electrical appliances, safety becomes more and more important. Currently, many home appliances are equipped with electrical circuit protection devices, such as leakage current detection interrupters (LCDI). An LCDI device uses a detection line in the power cord, such as a shield detection line, to detect a leakage current that exceeds a predetermined threshold. Such leakage current can occur when the hot or neutral wire of the power cord is aged, worn, damaged by animal crewing, etc. causing the insulation of the wires to be damaged and lose insulation effectiveness. Upon detecting a leakage current, the LCDI device will cut off the electrical connection between the input end and the output end to ensure safety and prevent fire hazard.

Assembling a conventional LCDI device requires putting multiple individual parts together, and requires utilizing tools to assist in fixing the positions of some of the parts in order to complete the assembly. This assembly process is time consuming and inefficient.

SUMMARY

To solve the above problems, embodiments of the present invention provide an LCDI device, which includes a shell, a movement unit, and a wire bundle assembly. The shell includes a base and an upper cover connected to each other. The movement unit is disposed in the base, and includes at least one connecting conductor. A first end of the wire bundle assembly is disposed in the upper cover and includes at least one shield detection line, where the shield detection line is electrically coupled to the connecting conductor. The shield detection line includes a connecting terminal at the first end of the wire bundle assembly which is configured to received and retain the connecting conductor inserted therein.

In some embodiments, the connecting conductor includes a conductor plate defining a positioning hole, and a position limiting structure disposed on one side of the conductor plate.

In some embodiments, the connecting terminal includes a bump on an inner side, wherein the bump is configured to fall into the positioning hole of the conductor plate when the conductor plate is inserted into the connecting terminal, and wherein the position limiting structure is configured to limit a longitudinal position of the conductor plate inserted into the connecting terminal, whereby the conductor plate and is electrically coupled to the shield detection line.

In another aspect, the present invention provides an LCDI device, which includes: a shell, including a base and an upper cover connected to each other; a movement unit disposed in the base; and a wire bundle assembly; wherein the movement unit includes at least one first fastener member located on a first sidewall of the movement unit, and at least one second fastener member located on a second sidewall of the movement unit opposite the first sidewall; wherein the base has at least one first fastener member corresponding to the at least one first fastener member of the movement unit, and at least one second fastener member corresponding to the at least one second fastener member of the movement unit; and wherein each first fastener member of the movement unit is configured to cooperate with a corresponding first fastener member of the base, and each second fastener member of the movement unit is configured to cooperate with a corresponding second fastener member of the base, to assemble the movement unit in the base.

In another aspect, the present invention provides an LCDI device, which includes a shell, including a base and an upper cover connected to each other; a movement unit disposed in the base; and a wire bundle assembly; wherein the upper cover includes at least one third fastener member located on a first sidewall of the upper cover, and at least one fourth fastener member located on a second sidewall of the upper cover opposite the first sidewall; wherein the base has at least one third fastener member corresponding to the at least one third fastener member of the upper cover, and at least one fourth fastener member corresponding to the at least one fourth fastener member of the upper cover; and wherein each third fastener member of the upper cover is configured to cooperate with a corresponding third fastener member of the base, and each fourth fastener member of the upper cover is configured to cooperate with a corresponding fourth fastener member of the base, to assemble the upper cover to the base.

In some embodiments, the shell further includes a rear cover configured to be connected to a part of the upper cover, wherein the first end of the wire bundle assembly is disposed between the rear cover and the upper cover.

In another aspect, the present invention provides an LCDI device, which includes a shell, including a base and an upper cover connected to each other; a movement unit disposed in the base, having at least one input contact terminal and at least one corresponding output contact terminal; a wire bundle assembly; and a fire shield, disposed between the shell and the movement unit, configured to separate the input contact terminal and the output contact terminal from the shell.

In some embodiments, the fire shield is formed of a high temperature resistant material.

BRIEF DESCRIPTION OF THE DRAWINGS

Preferred embodiments of the present invention are described with reference to the drawings. These drawings serve to explain the embodiments and their operating principle, and only illustrate structures that are necessary to the understanding of the principles of the invention. These drawings are not necessarily to scale. In the drawings, like features are designated by like reference symbols.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

Embodiments of the present invention address the following technical problems: To reduce the complexity of the assembly of the LCDI device, and to improve production efficiency.

To solve the above problems, embodiments of the present invention provide an LCDI device, which includes a shell, a movement unit, and a wire bundle assembly. The shell includes a base and an upper cover connected to each other. The movement unit is disposed in the base, and includes at least one connecting conductor. A first end of the wire bundle assembly is disposed in the upper cover and includes at least one shield detection line, where the shield detection line is electrically coupled to the connecting conductor. The shield detection line includes a connecting terminal at the first end of the wire bundle assembly which is configured to received and retain the connecting conductor inserted therein.

Figure 1:
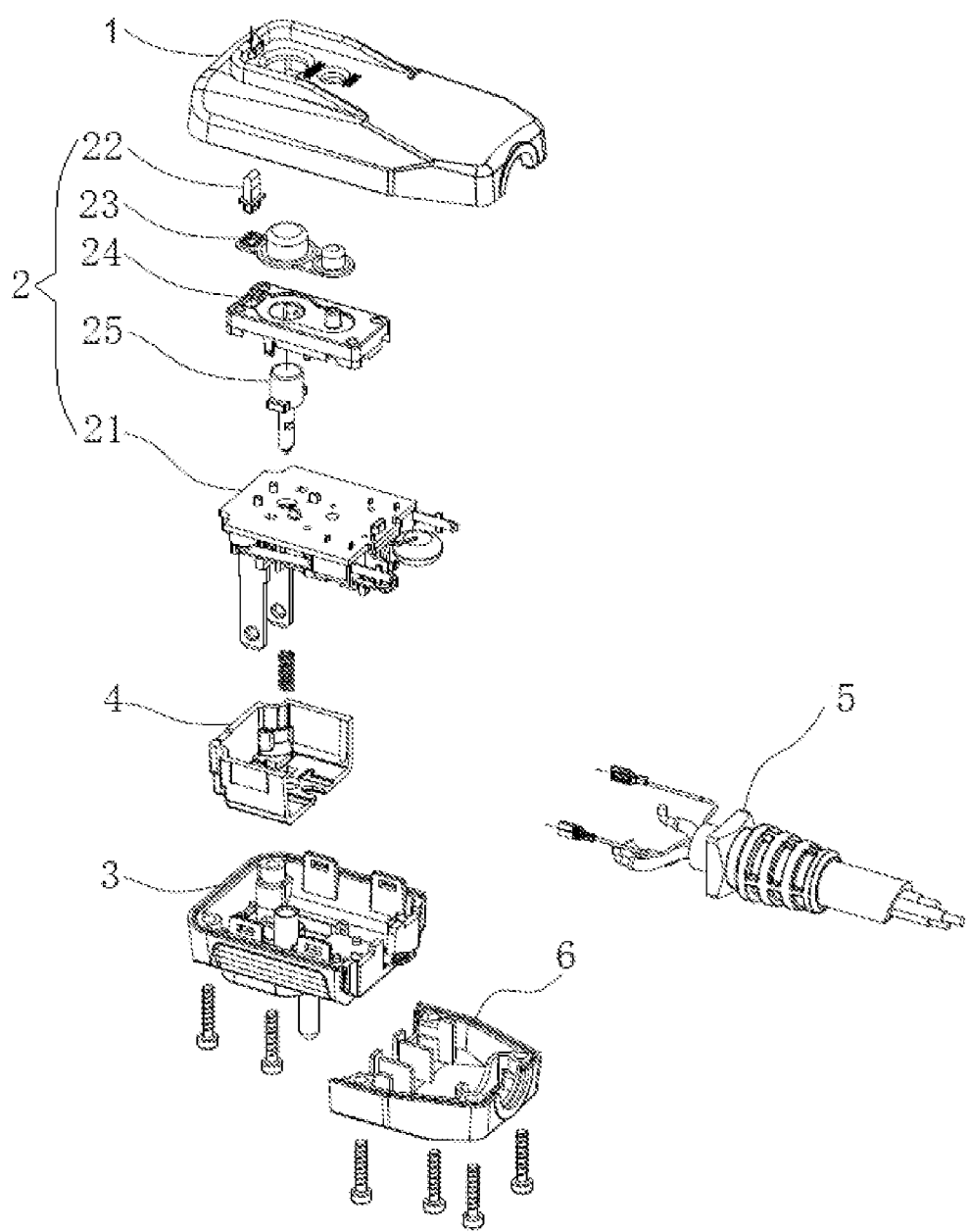
FIG. 1 is an exploded view of an LCDI device according to an embodiment of the present invention.
Figure 2A:
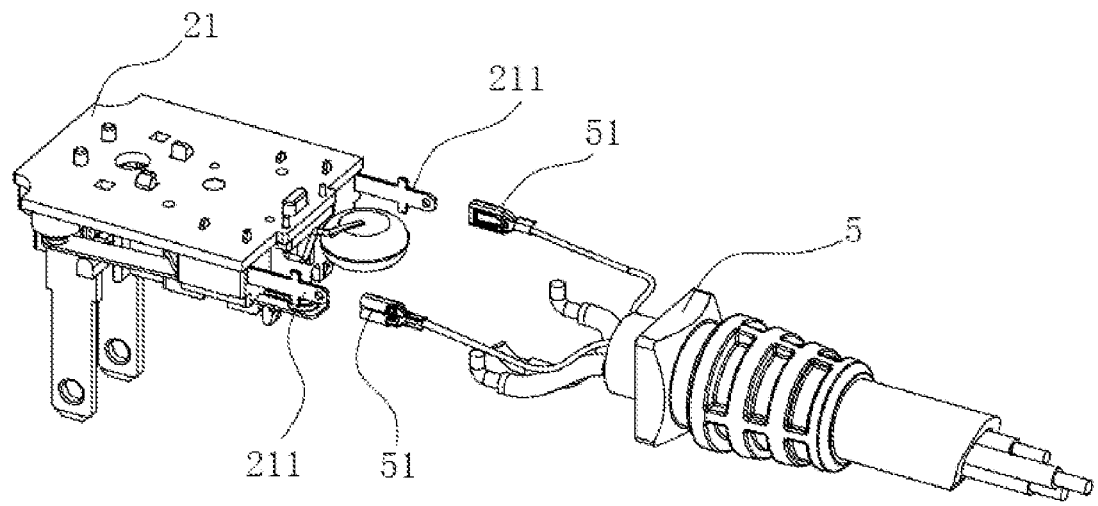
FIGS. 2a-2d illustrate the structures and engagement of the movement unit and the wire bundle assembly of the LCDI device of the embodiment.
Figure 2B:
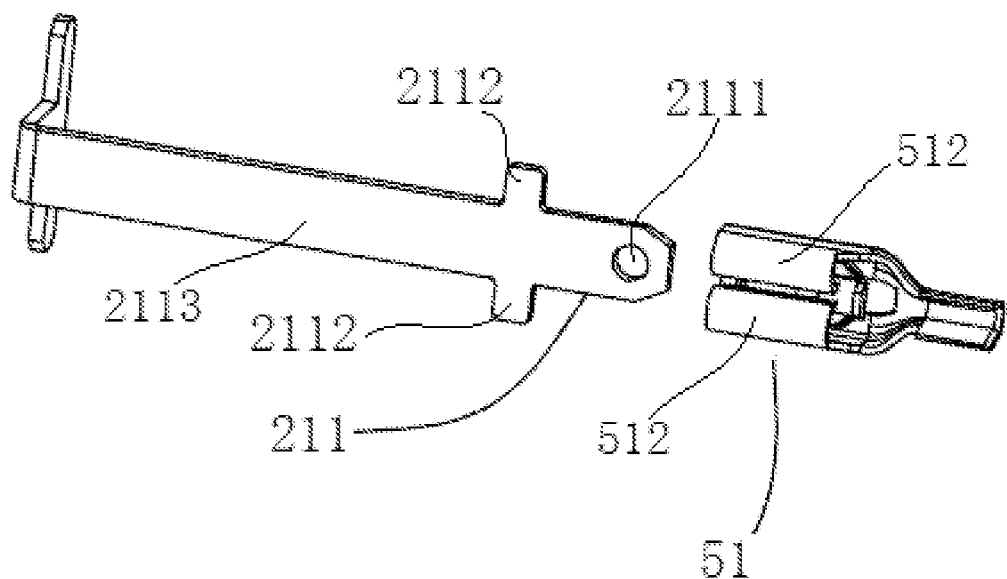
Figure 2C:
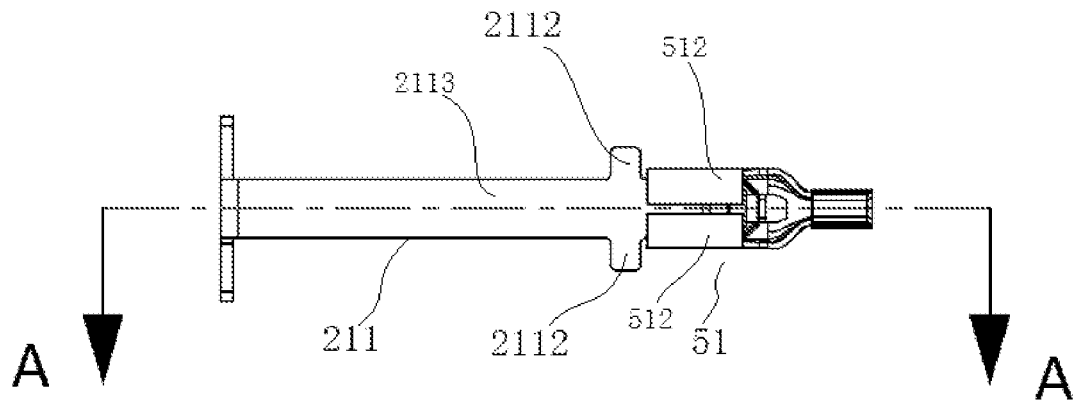
Figure 2D:
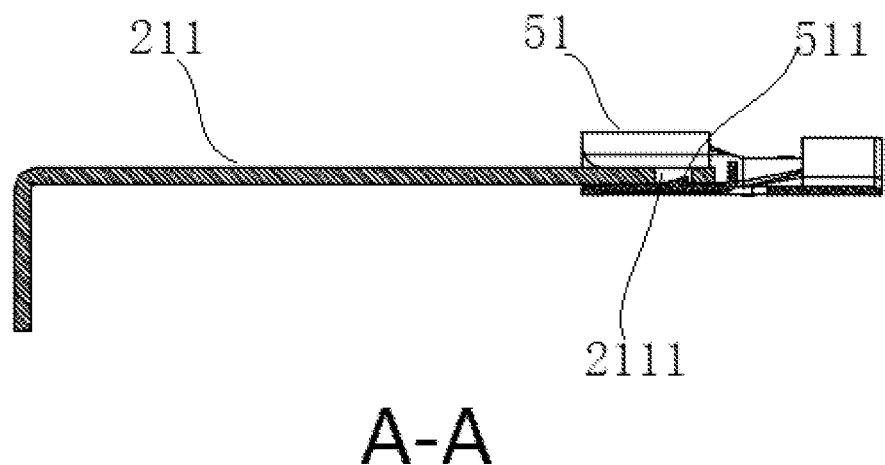

FIG. 1 (exploded view) illustrates an overall structure of the LCDI device according to an embodiment of the present invention. The LCDI device includes a shell (which includes an upper cover 1, a base 3, and a rear cover 6), a movement unit 2, a wire bundle assembly 5, and a fire shield 4. The movement unit 2 is disposed in the base 3, and the fire shield 4 is disposed between the movement unit 2 and the base 3. The movement unit 2 is electrically and mechanically coupled to the wire bundle assembly 5. A part of the wire bundle assembly 5 is disposed in the rear cover 6 (between the rear cover 6 and the upper cover 1). The upper cover 1 is coupled to the base 3 and rear cover 6.

The movement unit 2 includes a light emitting element 22, a waterproof cap 23, an inner cover 24, a reset button 25 and a movement assembly 21. The light emitting element 22, waterproof cap 23, inner cover 24 and reset button 25 are disposed on the movement assembly 21.

As shown in FIGS. 2a-2d, the movement assembly 21 includes a pair of connecting conductors 211, and one end of the wire bundle assembly 5 includes a pair of shield detection lines, where the pair of shield detection lines are respectively coupled to the pair of connecting conductors 211. More specifically, each connecting conductor 211 includes a conductor plate 2113, which includes a positioning hole 2111 near the end and at least one position limiting structure 2112 at one side. In the illustrated embodiment, two position limiting structures 2112 (protrusions) are provided, respectively located on the two sides of the conductor plate 2113.

Further, each shield detection line of the wire bundle assembly 5 is provided with a connecting terminal 51. The connecting terminal 51 has a bump 511 on its inner side. As shown in FIGS. 2a-2d, in this embodiment, the bump 511 is a metal spring plate. When each connecting conductor 211 is inserted into the corresponding connecting terminal 51, the bump 511 falls into the positioning hole 2111. Meanwhile, the connecting terminal 51 further includes a pair of resilient tabs 512, which push the conductor plate 2113 toward the bump 511 to retain the conductor plate 2113 in the connecting terminal 51. The position limiting structures 2112 limit the longitudinal position of the conductor plate 2113 within the connecting terminal 51. This way, the conductor plate 2113 is electrically coupled to the corresponding shield detection line.

In this embodiment, by using the connecting terminals, the shield detection lines can be quickly connected to the corresponding conductor plates of the movement assembly by directly inserting the conductor plates into the connecting terminals. This achieves fast assembly and secure connection.

Figure 3:
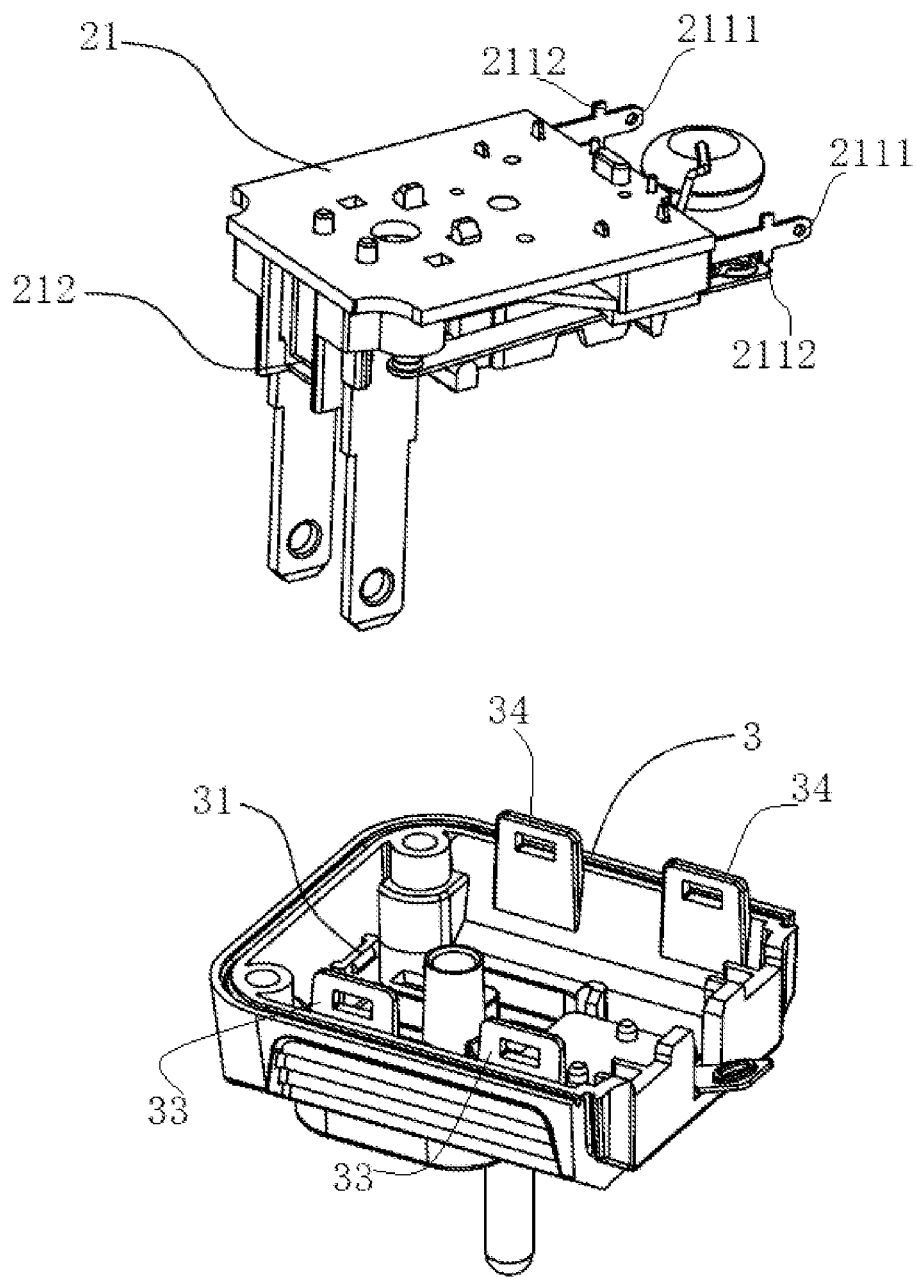
FIG. 3 is an illustration of the structures of the movement assembly and the shell base of the LCDI device.
Figure 4:
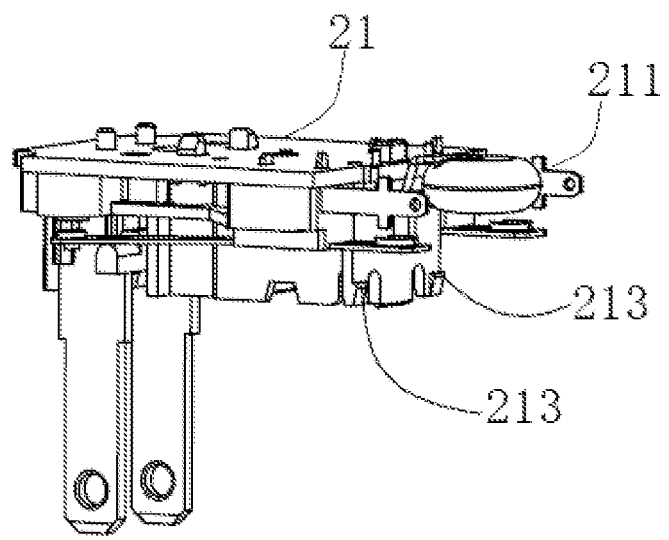
FIG. 4 is another illustration of the structures of the movement assembly and the shell base of the LCDI device.
Figure 4:
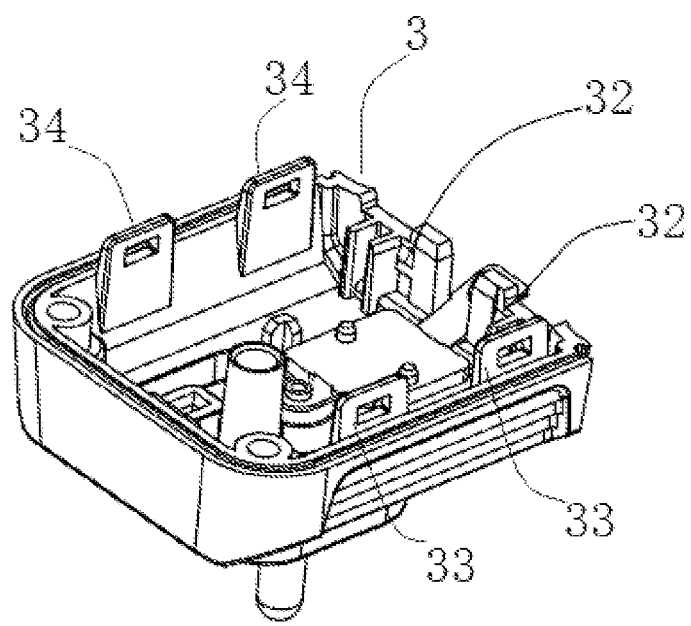
Figure 5:
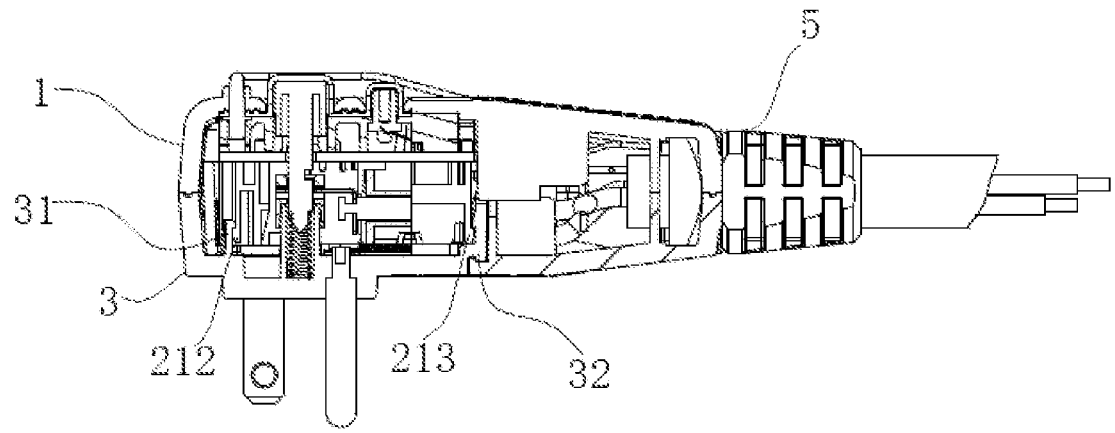
FIG. 5 illustrates an overall structure of the LCDI device.
Figure 6:
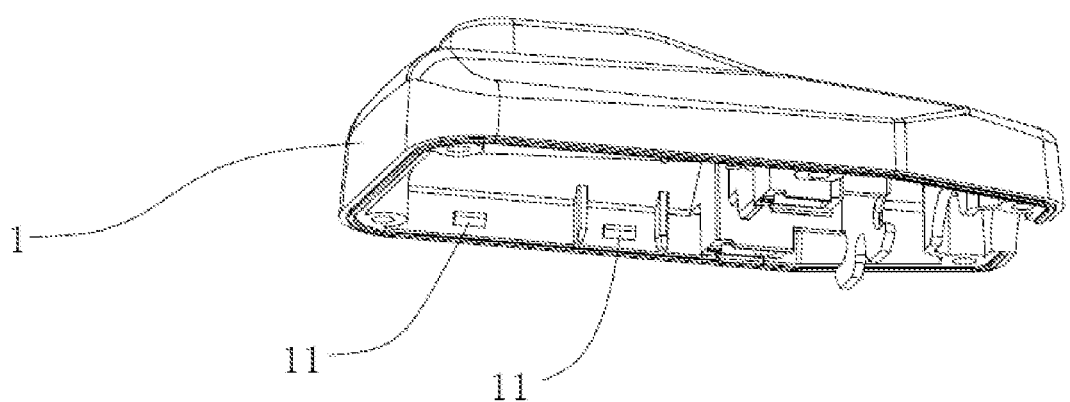
FIG. 6 illustrates the upper cover of the shell of the LCDI device.
Figure 7:
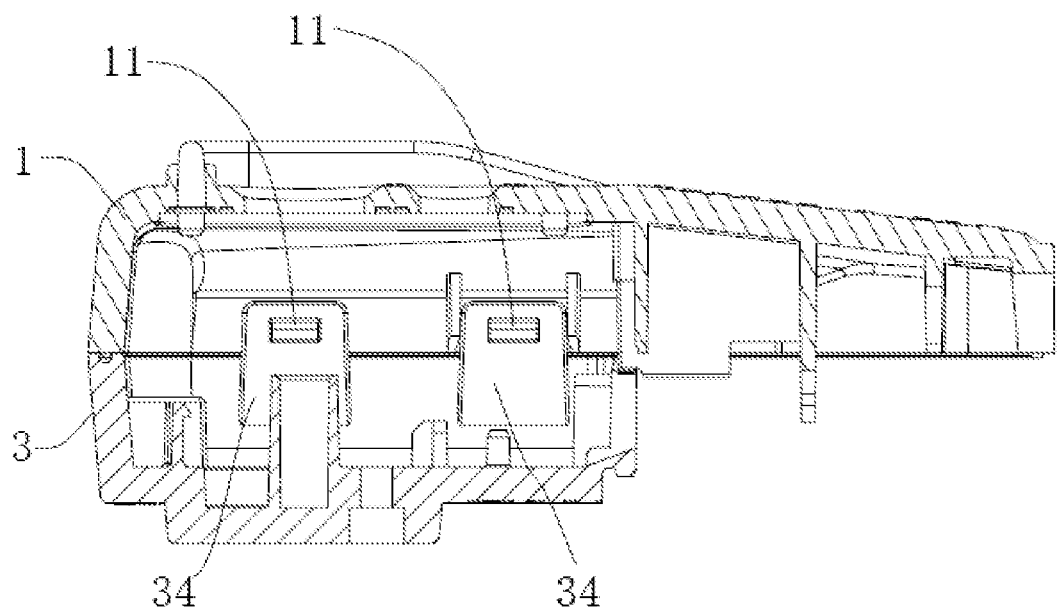
FIG. 7 illustrates the cooperation and engagement of the upper cover and the base of the shell of the LCDI device.

As shown in FIGS. 3-5, the movement assembly 21 has at least one first fastener member 212 located on a first sidewall (not shown) of the movement assembly, and at least one second fastener member 213 located on a second sidewall (not shown) opposite the first sidewall. In the illustrated embodiment, two second fastener members 213 are provided.

Correspondingly, the base 3 has at least one first fastener member 31 located on a first sidewall (not shown) of the base, and at least one second fastener member 32 located on a second sidewall (not shown) opposite the first sidewall. The first and second sidewalls are joined to the bottom plate of the base 3. In the illustrated embodiment, two second fastener members 32 are provided.

When assembling the movement unit 2 in the base 3, each first fastener member 212 of the movement unit 2 cooperates with a corresponding first fastener member 31 of the base 3, and each second fastener member 213 of the movement unit 2 cooperates with a corresponding second fastener member 32 of the base 3.

In this embodiment, preferably, the first fastener member 31 of the base 3 is a hook, and the amount of its elastic deformation is larger than that of the first fastener member 212 (a hook retainer) of the movement unit 2; the second fastener member 213 of the movement unit 2 is a hook, and the amount of its elastic deformation is larger than that of the second fastener member 32 (a hook retainer) of the base 3. It should be noted that the structures of the first and second fastener members 212 and 213 of the movement unit 2 and the corresponding first and second fastener members 31 and 32 of the base 3 are not limited to the hooks and hook retainers described above. Rather, any suitable structures may be used, such as hooks of various shapes, hook retainer of various shapes, protrusions of various shapes, recesses of various shapes, etc.

The fastener structures described above allow the movement unit 2 to be easily assembled in the base 3, without the assistance of any tools. This saves time and improves yield and production efficiency.

As shown in FIGS. 3, 4, 6 and 7, the upper cover 1 has at least one third fastener member 11 located on a first sidewall (not shown), and at least one fourth fastener member (not shown) located on a second sidewall opposite the first sidewall. The base 3 has at least one third fastener member 33 located on a third sidewall (not shown), and at least one fourth fastener member 34 located on a fourth sidewall (not shown) opposite the third sidewall. The third and fourth sidewalls are adjacent to the first sidewall and joined to the bottom plate of the base 3.

In this embodiment, preferably, two third fastener members 33 are provided on the third sidewall of the base 3 and two fourth fastener members 34 are provided on the fourth sidewall of the base 3. The two third fastener members 33 of the base 3 respectively correspond to the two third fastener members 11 of the upper cover 1, and the two fourth fastener members 34 of the base 3 respectively correspond to the two fourth fastener members of the upper cover 1. It should be noted that the structures of the third and fourth fastener members of the upper cover 1 and the corresponding third and fourth fastener members of the base 3 may gave any suitable structures, such as hooks of various shapes, hook retainer of various shapes, protrusions of various shapes, recesses of various shapes, etc.

When affixing the upper cover 1 to the base 3, each third fastener member 11 of the upper cover 1 cooperates with the corresponding third fastener member 33 of the base 3, and each fourth fastener member of the upper cover 1 cooperates with the corresponding fourth fastener member 34 of the base 3.

The fastener structures described above allow the upper cover 1 to be directly affixed to the base 3 during assembly, without the assistance of any tools or screws. This saves time and improves yield and production efficiency.

Figure 8:
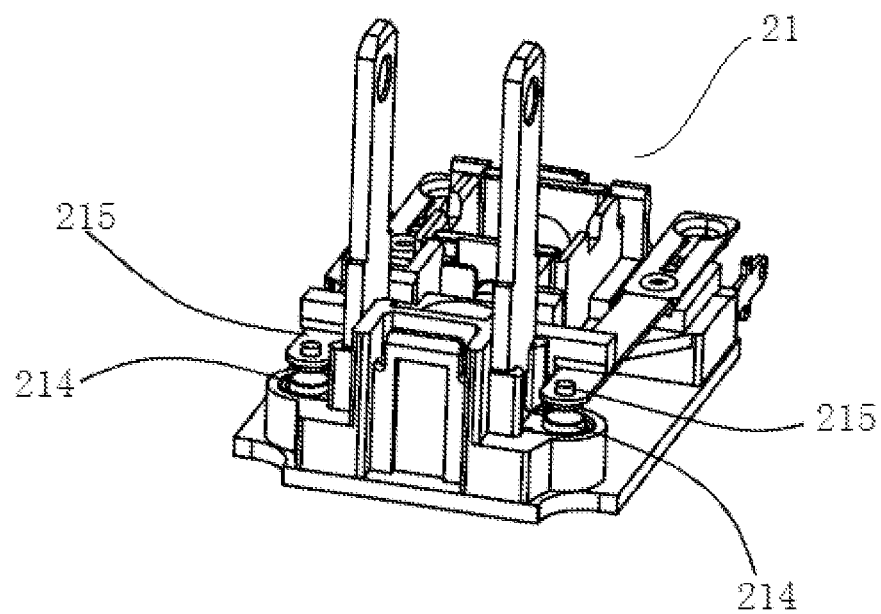
FIG. 8 is a perspective view showing the movement assembly of the LCDI device.

Further, as shown in FIG. 1, the fire shield 4 is disposed between the movement unit 2 and the shell to completely cover the movement unit 2 with the fire shield 4 so as to separate the pair of input contact terminals 214 and output contact terminals 215 of the movement assembly 21 (shown in FIG. 8) from the shell. For example, the fire shield 4 may separate the contact terminals 214 and 215 from any one or more of the upper cover 1, the base 3 and the rear cover 6. This prevents high temperature arcs, which may be generated by the contact terminals 214 and 215 during disconnection, from melting the shell. The fire shield 4 may be formed of a suitable high-temperature resistant material such as ceramic, engineering plastic, asbestos, epoxy, metal, polyphenylene sulfide (PPS), etc. Compared to conventional LCDI devices which do not use an internal fire shield or uses a fire shield that only partially covers the movement unit, the LCDI device described in the instant application can withstand extreme conditions; even when the internal temperature is high, the device can still withstand higher temperature, and prevent fire hazard.

In summary, the LCDI device according to embodiments of the present invention can be assembled without tools, which enhances the ease of assembling and increases production efficiency. The device can also improve safety of the device and is more user friendly.

While the present invention is described above using specific examples, these examples are only illustrative and do not limit the scope of the invention. It will be apparent to those skilled in the art that various modifications, additions and deletions can be made to the LCDI device of the present invention without departing from the spirit or scope of the invention.

What is claimed is:

1. A leakage current detection interrupters (LCDI) device, comprising:
   a shell, including a base and an upper cover connected to each other;
   a movement unit, disposed in the base and including at least one connecting conductor; and
   a wire bundle assembly, having a first end disposed in the upper cover, the first end of the wire bundle assembly including at least one shield detection line, wherein the shield detection line is electrically coupled to the connecting conductor;
   wherein the shield detection line includes a connecting terminal at the first end of the wire bundle assembly, wherein the connecting terminal is configured to receive and retain the connecting conductor inserted therein;
   wherein the movement unit further includes at least one first fastener member located on a first sidewall of the movement unit, and at least one second fastener member located on a second sidewall of the movement unit opposite the first sidewall;
   wherein the base has at least one first fastener member corresponding to the at least one first fastener member of the movement unit, and at least one second fastener member corresponding to the at least one second fastener member of the movement unit; and
   wherein each first fastener member of the movement unit is configured to cooperate with a corresponding first fastener member of the base, and each second fastener member of the movement unit is configured to cooperate with a corresponding second fastener member of the base, to assemble the movement unit in the base.

2. The LCDI device of claim 1, wherein the connecting conductor includes:
   a conductor plate, the conductor plate defining a positioning hole; and
   a position limiting structure disposed on one side of the conductor plate.

3. The LCDI device of claim 2, wherein the connecting terminal includes a bump on an inner side, wherein the bump is configured to fall into the positioning hole of the conductor plate when the conductor plate is inserted into the connecting terminal, and wherein the position limiting structure is configured to limit a longitudinal position of the conductor plate inserted into the connecting terminal, whereby the conductor plate and is electrically coupled to the shield detection line.

4. The LCDI device of claim 1, wherein the shell further includes a rear cover configured to be connected to a part of the upper cover, wherein the first end of the wire bundle assembly is disposed between the rear cover and the upper cover.

5. The LCDI device of claim 1,
   wherein the movement unit further includes at least one input contact terminal and at least one corresponding output contact terminal;
   the LCDI device further comprising a fire shield, disposed between the shell and the movement unit, configured to separate the input contact terminal and the output contact terminal from the shell.

6. The LCDI device of claim 5, wherein the fire shield is formed of a high temperature resistant material.

7. A leakage current detection interrupters (LCDI) device, comprising:
   a shell, including a base and an upper cover connected to each other;
   a movement unit, disposed in the base and including at least one connecting conductor; and
   a wire bundle assembly, having a first end disposed in the upper cover, the first end of the wire bundle assembly including at least one shield detection line, wherein the shield detection line is electrically coupled to the connecting conductor;

wherein the shield detection line includes a connecting terminal at the first end of the wire bundle assembly, wherein the connecting terminal is configured to receive and retain the connecting conductor inserted therein;

wherein the upper cover includes at least one third fastener member located on a first sidewall of the upper cover, and at least one fourth fastener member located on a second sidewall of the upper cover opposite the first sidewall;

wherein the base has at least one third fastener member corresponding to the at least one third fastener member of the upper cover, and at least one fourth fastener member corresponding to the at least one fourth fastener member of the upper cover; and wherein each third fastener member of the upper cover is configured to cooperate with a corresponding third fastener member of the base, and each fourth fastener member of the upper cover is configured to cooperate with a corresponding fourth fastener member of the base, to assemble the upper cover to the base.

8. The LCDI device of claim 7, wherein the shell further includes a rear cover configured to be connected to a part of the upper cover, wherein the first end of the wire bundle assembly is disposed between the rear cover and the upper cover.

9. The LCDI device of claim 7, wherein the connecting conductor includes:
   a conductor plate, the conductor plate defining a positioning hole; and
   a position limiting structure disposed on one side of the conductor plate.

10. The LCDI device of claim 9, wherein the connecting terminal includes a bump on an inner side, wherein the bump is configured to fall into the positioning hole of the conductor plate when the conductor plate is inserted into the connecting terminal, and wherein the position limiting structure is configured to limit a longitudinal position of the conductor plate inserted into the connecting terminal, whereby the conductor plate and is electrically coupled to the shield detection line.

11. The LCDI device of claim 7,
    wherein the movement unit further includes at least one input contact terminal and at least one corresponding output contact terminal;
    the LCDI device further comprising a fire shield, disposed between the shell and the movement unit, configured to separate the input contact terminal and the output contact terminal from the shell.

12. The LCDI device of claim 11, wherein the fire shield is formed of a high temperature resistant material.

* * * * *